US005661074A

United States Patent [19]
Tischler

[11] Patent Number: 5,661,074
[45] Date of Patent: Aug. 26, 1997

[54] HIGH BRIGHTNESS ELECTROLUMINESCENT DEVICE EMITTING IN THE GREEN TO ULTRAVIOLET SPECTRUM AND METHOD OF MAKING THE SAME

[75] Inventor: Michael A. Tischler, Danbury, Conn.

[73] Assignee: Advanced Technology Materials, Inc., Danbury, Conn.

[21] Appl. No.: 448,743

[22] Filed: May 24, 1995

Related U.S. Application Data

[62] Division of Ser. No. 383,425, Feb. 3, 1995, Pat. No. 5,585,648.

[51] Int. Cl.$^6$ ............................................. H01L 21/20
[52] U.S. Cl. ..................... 438/32; 117/90; 117/95; 117/97; 117/952; 438/41; 438/47
[58] Field of Search ............... 117/90, 97, 95, 117/952; 437/127, 129

[56] References Cited

U.S. PATENT DOCUMENTS

| | | | |
|---|---|---|---|
| 3,922,703 | 11/1975 | Pankove | 357/17 |
| 4,099,305 | 7/1978 | Cho et al. | 437/129 |
| 4,862,471 | 8/1989 | Pankove | 372/45 |
| 4,918,497 | 4/1990 | Edmond | 357/17 |
| 4,985,742 | 1/1991 | Pankove | 357/34 |
| 5,005,057 | 4/1991 | Izumiya et al. | |
| 5,076,860 | 12/1991 | Ohba et al. | 148/33.1 |
| 5,156,995 | 10/1992 | Fitzgerald, Jr. et al. | 437/133 |
| 5,210,051 | 5/1993 | Carter, Jr. | 437/107 |
| 5,247,533 | 9/1993 | Okazaki et al. | 372/45 |
| 5,281,831 | 1/1994 | Uemoto et al. | 257/102 |
| 5,284,792 | 2/1994 | Forster et al. | 437/129 |
| 5,290,393 | 3/1994 | Nakamura | |
| 5,326,992 | 7/1994 | Yoder | 257/77 |
| 5,387,804 | 2/1995 | Suzuki et al. | 257/77 |
| 5,393,993 | 2/1995 | Edmond et al. | |
| 5,432,808 | 7/1995 | Hatano et al. | 372/45 |

FOREIGN PATENT DOCUMENTS

| | | |
|---|---|---|
| 164794 | 6/1990 | Japan . |
| 231778 | 9/1990 | Japan . |
| 167477 | 6/1992 | Japan . |

OTHER PUBLICATIONS

"High Power GaN P–N Junction Blue–Light–Emitting Diodes" J–Appl. Phys. vol. 30, No. 12A Dec. 1991 pp. L1998–L2001.

"High–power InGaN/GaN double–heterostructure violet light emitting diodes." Appl. Phys. Lett., vol. 62 No. 19, 10 May 1993 pp.2390–2392.

"Stimulated Emission Near Ultraviolet at Room Temperature from a GaN film Grown on Sapphire by Movpe Using an AlN Buffer Layer" Jpn J. of Applied Physics vol. 29, No. 2 Feb. 1990. pp. L205–L206.

(List continued on next page.)

*Primary Examiner*—Robert Kunemund
*Attorney, Agent, or Firm*—Janet R. Elliott; Steven J. Hultquist

[57] ABSTRACT

A green-blue to ultraviolet light-emitting optical device, e.g. a green-blue to ultraviolet emitting laser or a green-blue to ultraviolet emitting diode, comprising a green-blue to ultraviolet light emitting gallium nitride material on a base structure including a silicon carbide substrate, which preferably consists of 2H—SiC, 4H—SiC, or a-axis oriented 6H—SiC. The carrier mobility and the transparency of the silicon carbide substrate are optimized by the selection of orientation and polytype, thus enhancing device performance. The light-emitting diodes may incorporate a structural modification to increase the light output comprising a dielectric Bragg mirror beneath the LED structure, made of alternating layers of AlN, GaN, InN or their alloys. Methods for making such light-emitting diodes are provided, including a technique for defining individual devices by mesa etching which avoids possible damage to the active area during dicing.

15 Claims, 5 Drawing Sheets

OTHER PUBLICATIONS

"Room-Temperature Low-Threshold Surface-Stimulated Emission by Optical Pumping from $Al_{0.1}Ga_{0.9}N$/GaN Double Hetero-structure" Jpn J. Appl. Phys. vol. 32(1993) pp. L 1000-L1002 Part 2 No. 7B, 15 Jul. 1993.

"Vertical-cavity, room temperature stimulated emission from photopumped Ga N films deposited over sapphire substrates using Low-pressure metalorganic chemical vapor deposition" Appl. Phys Lett. 58 (14), 8 Apr. 1991 pp. 1515-1517.

"Reflective filters based on single-crystal $GaN/Al_xGa_{1-x}N$ multilayers deposited using low-pressure metalorganic chemical vapor deposition" Appl. Phys Lett. 59(12), 16 Sep. 1991 pp. 1449-1451.

"Defect reduction in GaAs epitaxial layers using a GaAsP--InGaAs strained layer super lattice". Appl. Phys Lett. 46(3) Feb. 1, 1985 p. 294.

"High Power Silicon Carbide IMPATT Diode Development" AIAA SD10 Interceptor Technology Conf. Jun. 1993.

"High-Luminosity Blue and Blue-Green Gallium Nitride Light-Emitting Diodes" Science vol. 267 Jan. 6, 1995 pp. 51-55.

"GaN grown on hydrogen plasma cleaned 6H-SiC substrates" Appl. Phys Lett. vol. 62 No. 7, Feb. 15, 1993 pp. 702-704.

"A comparative study of GaN epilayers grown on sapphire and SiC substrates by plasma-assisted molecular-beam epitaxy" Appl. Phys. Lett. 62 (26) Jun. 28, 1993 pp. 3479-3481.

"Deposition, Characterization, and device development in diamond, silicon carbide, and gallium nitride thin films" J. Vac. Sci. Technol. A11(4) Jul./Aug. 1993 pp. 829-837.

HIGH BRIGHTNESS ELECTROLUMINESCENT DEVICE EMITTING IN THE GREEN TO ULTRAVIOLET SPECTRUM AND METHOD OF MAKING THE SAME

This is a division of U.S. application Ser. No. 08/383,425 filed Feb. 3, 1995, now U.S. Pat. No. 5,585,648.

BACKGROUND OF THE INVENTION

1. Field of the Invention

The present invention relates to a light emitting-optical device capable of emitting light in the green-blue to ultraviolet spectrum, comprising a gallium nitride active layer on a silicon carbide substrate; and a method for making the same.

2. Description of the Related Art

Electroluminescent semiconductor devices such as lasers and light-emitting diodes (LEDs) that emit light in the green-blue to ultraviolet region of the electromagnetic spectrum are of great interest; but have not yet reached the levels of performance that are presently available in red and yellow light emitters, as measured by quantum efficiency and luminous intensity. The major reason for the deficiency of the blue light-emitting devices is the much less well developed state of the semiconductor materials that are suitable for blue light emission.

The semiconductor materials principally used for blue light emission are the II–VI compounds, silicon carbide, and the III–V nitrides.

The II–VI compounds such as ZnSe, ZnS, CdS, and their alloys are direct band gap materials and thus have high optical efficiency. However, while LEDs and lasers have been demonstrated in II–VI compounds, the lack of stability and the short lifetimes of devices made from them are serious concerns. Recently, it has been demonstrated that the short lifetimes in II–VI devices result from the rapid propagation of defects throughout their active regions, which act as nonradiative recombination sites. These results are indicative of low temperature and room temperature characteristics. Operation at higher temperatures or at high powers will increase the degradation rate and exacerbate the problem. Additional problems with the II–VI materials include the necessity of using quaternary layers to achieve blue emission in relatively lattice-matched heterostructures. The simplest and most well developed materials are ZnSe, ZnS, CdS, and their alloys which produce emission in the blue-green region, about 500 nm. Other II–VI compounds could be used to produce emission in the blue and ultraviolet, for example alloys of ZnS and either ZnSe, CdS, CdSe or MnSe. However, these materials have not been well investigated and have other major problems including the lack of a simple lattice-matched heterostructure system and the lack of a suitable substrate.

Blue LEDs formed in silicon carbide epilayers on silicon carbide substrates have been reported (U.S. Pat. No. 4,918, 497). However, silicon carbide is an indirect band gap material, and therefore radiative recombination is inefficient, and consequently these SiC-based light emitting diodes (LEDs) have poor optical efficiency. A commercially available 6H-polytype SiC LED with a peak light emission at a wavelength of 470 nm has an external quantum efficiency of 0.02% and performance of 0.04 lumens/watt (Cree Research, Durham, N.C.). This performance is quite low compared to the best LEDs emitting in the red (AlGaAs, 16% quantum efficiency and 8 lumens/watt) and yellow-green (AlInGaP, 1% quantum efficiency and 6 lumens/watt), where quantum efficiency is defined as the number of photons emitted per electron supplied×100%, and luminous intensity is the luminous (visible) flux output of a light source measured in lumens divided by the electrical power input to the device. Lumens are calculated by multiplying the radiant flux output of a device (in watts) by the human eye's sensitivity as defined by the Commission Internationale de L'Eclairage (CIE), and so the luminous efficiency is related to the amount of light perceived by the human eye per power input.

The performance of SiC LEDs cannot be expected to match the performance of the III–V direct band gap materials. In addition, there is no convenient heterostructure system for SiC. A convenient heterostructure system is important because it increases device efficiency and permits selection of the emission wavelength.

The best choice for blue and UV light emitter applications appears to be the III–V nitrides, i.e. GaN, AlN, InN and their ternary and quaternary alloys such as AlGaN, InGaN, or AlInGaN. The III–V nitrides meet many of the requirements for making light emitting devices. These materials possess direct band gaps, a convenient, well lattice-matched heterostructure system, the ability to choose the output wavelength by varying the composition and structure, and good thermal stability. The III–V nitrides exhibit strong luminescence in the ultraviolet and blue.

These nitrides and their alloys are referred to herein as Ga*N materials. As used herein, the term Ga*N refers to binary (e.g. GaN), ternary (MGaN), and quaternary (MM'GaN) type gallium nitride compounds, including, by way of example, such compounds as AlN, InN, AlGaN, InGaN, InAlN, and AlInGaN, wherein M is a metal which is compatible with Ga and N in the composition MGaN and the composition MGaN is stable at standard temperature and pressure (25° C. and one atmosphere pressure) conditions, and wherein M' is a compatible metal providing quaternary compounds of the formula $M_{1-x-y}M'_yGa_xN$, wherein x and y range from 0 to 1. It will be further understood that ternary and quaternary compounds may be referred to by general formula without subscripts, e.g., AlGaInN, wherein the stoichiometric coefficients (for aluminum, gallium, and indium, in this instance) have been deleted for general reference purposes, it being understood that such alloy compositions entail stoichiometry relative to the metal components which provides a stable composition at the aforementioned standard temperature and pressure conditions.

Recent improvements in growth and p-type doping have led to several demonstrations of high efficiency, GaN-based blue LEDs. GaN LEDs grown on (0001) oriented sapphire have exhibited an external quantum efficiency of 0.18%, almost 10 times that of SiC LEDs (S. Nakamura et al., Jpn, J. of Appl. Phys. 30 (1991) L1998). More recently, AlGaN/GaN heterostructure LEDs with outputs of 1000 mcd at 20 mA (Nikkei Electronics Dec. 20, 1993 (No. 597)) have been reported. By comparison, SiC LEDs emit only about 25 mcd at 20 mA. Additionally, stimulated emission by photopumping has been demonstrated in GaN (H. Amano et al., Jap. J. Appl. Phys. 29 (1990) L205); M. A. Khan et al., Appl. Phys. Lett. 58 (1991) 1515). Finally, the III–V nitrides possess many similarities to the III–V arsenides GaAs and AlAs, and so growth and fabrication techniques that have been well developed for the latter materials may be employed in fabricating nitride-based devices as well.

The band gap of GaN is 3.4 eV while that of AlN is 6.2 eV and InN is 2.09 eV. Thus a device with a GaN active layer would emit at about 365 nm for band to band recombination. Like GaAs/AlAs, GaN/AlN form a closely lattice-matched heterostructure system. The difference in the lattice constants of GaN and AlN is about 2.5%. While larger than the difference between the lattice constants of GaAs and AlAs, this fairly close match does permit the use of GaN/AlGaN alloys with mismatches of less than 0.5%. Such a convenient heterostructure system is important for light emitting devices because it increases device efficiency and permits selection of the emission wavelength. The wavelength can be modified in several ways. The first is through the use of quantum well heterostructures, in which the emission energy increases as the well width decreases, because of quantum size effects. The second is the use of AlGaN alloys in the active region, which also increases the emission energy relative to GaN. Of course, these two techniques could be combined, if desired. The emission energy can be reduced by the addition of In to the active region alloy.

A key problem with the present GaN light emitting devices is that they are primarily fabricated on (0001) oriented sapphire ($Al_2O_3$) substrates. Use of sapphire has a number of problems. The first is that the lattice mismatch between GaN and sapphire is about 13.8%, which is quite large. This large lattice mismatch causes a high density of defects at the sapphire/GaN interface, in the range of $10^8$ to $10^{10}$ per $cm^2$, and these defects propagate up into the device's active region during growth of the active layer. Defects pose a serious problem to the reliable operation of optical emitter devices such as lasers and LEDs. Often optical devices have dark line defects which multiply during operation. This phenomenon is an especially important problem for emitters grown on lattice mismatched substrates or containing layers that are mismatched. With continued operation, the density of these dark line defects increases until the light output is reduced to an unacceptable level and device failure occurs. Therefore, the device performance of GaN/sapphire light emitters is limited by crystal quality effects.

Another problem with GaN light emitting devices fabricated on sapphire substrates is that sapphire is insulating, which means that the standard, simple LED or laser structures, with one contact on top and the other on the bottom, cannot be used. Additional fabrication steps must be used to make both contacts on the tops of the devices. Additionally, specialized wirebonding and packaging must be employed to accommodate the non-standard arrangement of the two top contacts. An important side effect of having to place both contacts on top of the device when a sapphire substrate is used is that the die or chip area must be about twice as large as the standard structure to leave room for both contacts on the top surface. This effectively halves the number of devices which can be made on a given substrate area, resulting in increased cost per device.

It would therefore be advantageous to employ substrates other than sapphire for III-V nitride devices.

Silicon carbide has several advantages as a substrate material for III-V nitride based light emitting devices. The first is that it provides a much closer lattice match to the III-V nitrides than does sapphire (3.4% vs. 13.8% for sapphire and GaN), leading to devices with fewer defects and thus higher efficiencies and longer lifetimes. The second is that SiC can be made conductive, which permits the use of simple and conventional LED and laser structures, with one contact on top and the other on the bottom. Less processing is required thereby, the conventional packages and packaging tools can be used, and the device-requires about one-half the area of an equivalent device made on a sapphire substrate. Finally, most polytypes of silicon carbide show high light transmittance throughout the visible light wavelengths and some show good transmittance even into the ultraviolet region.

GaN light emitting diodes that could be fabricated on bulk single crystal, single polytype SiC substrates, in particular (0001) oriented 6H—SiC or cubic 3C—SiC, have been proposed (U.S. Pat. No. 5,210,051). These combinations of materials could show significant advantages over the GaN/sapphire system. The hexagonal 2H—GaN/(0001)-oriented 6H—SiC system was selected because of the availability of the 6H—SiC substrate and the compatibility of the crystal structures. The cubic GaN/3C—SiC system was proposed likewise on the basis of crystal compatibility arguments, although bulk 3C—SiC substrates are not currently available and little is known of the preparation or properties of cubic GaN. The optimization of electrical and optical properties, in particular charge carrier mobilities and percent transmittance of light, have not been addressed, nor has the use of a heterostructure system, important because it increases device efficiency and permits selection of the emission wavelength. Methods to economically fabricate large quantities of GaN LEDs on SiC substrates have not been described. Device structures designed to increase the output of light emitted are needed. These issues are crucial to the economical production of high brightness, commercially viable blue light emitting devices.

It is therefore an object of the present invention to provide bright green-blue to ultraviolet light emitting devices with high optical efficiency, long lifetime, and a simple fabrication process which is compatible with current device fabrication, testing and packaging processes. The invention provides improved charge carrier mobilities and light transmittance. It is a further object of the invention to provide a method for making these bright blue light emitting devices.

It is a further object of this invention to provide a method for selection of the output wavelength of the light emitting device by control of the composition and structure of the active region of the device.

It is yet a further object of the invention to provide an alternative method for forming device definition during fabrication steps, to keep damage from the dicing operation, which may degrade the device characteristics, away from the active region, and thus to avoid the necessity of post-dicing etching step.

It is yet a further object of the invention to provide methods for reducing the misfit dislocation density at the interface between the substrate and the active layer.

It is yet a further object of the invention to provide a device structure that enhances the efficiency of light extraction from the light emitting device by means of Bragg mirrors that reflect light of the wavelength emitted by the device.

Other objects and aspects of the invention will be described in detail in the subsequent disclosure and claims.

SUMMARY OF THE INVENTION

In one aspect, the present invention relates to a bright green-blue-to-ultraviolet light emitting optical device, e.g. a green-blue-to ultraviolet emitting laser or a green-blue to ultraviolet emitting diode, comprising a Ga*N active layer and a silicon carbide substrate of an anisotropic polytype such as hexagonal or rhombohedral, preferably oriented such that growth of the Ga*N layers takes place on or slightly off-axis on an a-axis or c-axis oriented substrate. The SiC substrate preferably consists of 2H—SiC, 4H—SiC, or a-axis oriented 6H—SiC.

In another aspect, the invention may incorporate a structural modification to increase the light output comprising a dielectric Bragg mirror beneath the LED structure, made of alternating layers of AlN, GaN, InN or their alloys.

In another aspect, the device may be defined during device fabrication by a process comprising mesa etching, optional passivation of the mesa edge, and contact formation, to produce a device in which the critical p-n junction edge region is physically separated from the dicing region.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The present invention is based on the discovery that by using silicon carbide of a selected polytype and growing Ga*N on that substrate in selected orientations, light emitting devices, e.g. a green-blue to ultraviolet emitting laser or a green-blue to ultraviolet emitting diode, of surprisingly high quantum efficiency and luminous efficiency may be fabricated. The luminescence efficiency, charge carrier mobilities and transmittance of light are improved.

The substrate polytype and orientation are selected to optimize the performance of the light emitters. The properties that figure most strongly in this selection are crystal structure, charge carrier mobilities, and transparency of the substrate to light of the wavelengths desirably emitted by the light emitters.

SiC has over 200 polytypes, a situation that is a consequence of a one-dimensional variation in the stacking sequence of the Si—C layers. The polytype with the largest band gap is the 2H hexagonal form, with a band gap of 3.3 eV, which corresponds to a band-to-band emission wavelength of 380 nm. While the discussion is primarily directed to the 2H—SiC, 4H—SiC and 6H—SiC polytypes, it will be recognized that a wide variety of SiC polytypes may be utilized in the broad practice of the present invention. Generally preferred polytype species will have more isotropic crystal structures, high carrier mobilities, and low anisotropy of mobility.

GaN grows in hexagonal (2H) and cubic polytypes. The hexagonal polytypes grow on hexagonal SiC polytypes, and cubic GaN grows on 3C—SiC. High crystal quality hexagonal GaN epilayers can be obtained on 2H—, 4H— and 6H—SiC substrates.

In silicon carbide, the mobility of the charge carriers varies with the polytype. To maximize device performance, specific orientations and polytypes of SiC are selected to achieve a very high useful mobility. The mobility of 4H—SiC is about twice that of 6H—SiC, and that of 2H is even higher yet. Thus the use of 4H—SiC or 2H—SiC substrates immediately provides an advantage when a highly conductive substrate is desired, as it is for LED and laser devices. Conductivity $\sigma$ behaves as $\sigma = q\mu n$ where q is the electronic charge, $\mu$ is the carrier mobility and n is the carrier concentration. Because the mobility is twice as high in 4H—SiC compared to 6H—SiC, the conductivity can be made twice as high.

Figure 1:
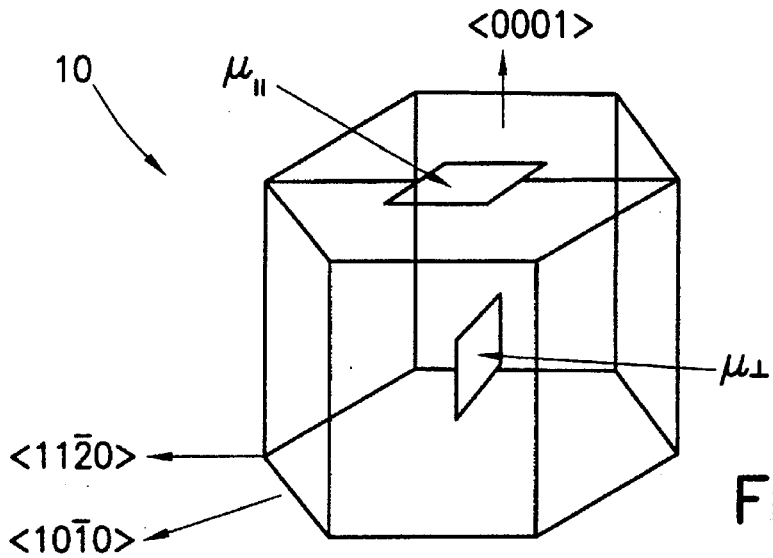
FIG. 1 shows a schematic representation of a hexagonal silicon carbide crystal, with the vertical arrow indicating the (0001) direction; the "a-axis" directions are denoted by the horizontal arrows, and the c-axis direction by the vertical arrow.

Another method to achieve high useful mobility is to ensure that the crystal's high mobility axis is aligned with the current flow direction. FIG. 1 shows a schematic of hexagonal SiC crystal 10 showing the crystallographic directions and sample orientations for measuring carrier mobility parallel to ($\mu //$) and perpendicular ($\mu \perp$) to the (0001) face. The mobilities in 6H—SiC measured in the (0001), $10\bar{1}0$ and $11\bar{2}0$ directions are given below:

| Carrier Concentration | Orientation | Mobility |
| --- | --- | --- |
| $2 \times 10^{18}$ | $10\bar{1}0$ ("a-axis") | 104 |
| $2 \times 10^{18}$ | $11\bar{2}0$ ("a-axis") | 79 |
| $2 \times 10^{18}$ | 0001 ("c-axis") | 35 |
| $2 \times 10^{18}$ | 0001 ("c-axis") | 28 |

It is clear that the mobility in the (0001) direction is much lower than that in the a-axis directions. Thus for the polytypes of SiC which have more anisotropic crystal structures, the use of specific orientations provides higher mobility and thus higher conductivity for device applications. Since the crystal structure is less anisotropic for 2H and 4H—SiC than for 6H—SiC, the mobility anisotropy is much less than in 6H—SiC. This approach is especially pertinent in the case of 6H—SiC, which is the polytype that is the most readily available commercially, and even though it does not have best properties, may be the practical selection for substrates.

To summarize, two methods are presented to achieve higher conductivities in SiC substrates and thus less power loss and more efficient operation in optical emitters. These are (1) to use higher mobility SiC polytypes, i.e. 2H and 4H—SiC, for the substrate and (2) to use specific orientations of anisotropic crystals to align the high mobility axis with the current flow direction, i.e. the a-axis orientation of the 6H—SiC polytype.

The high carrier mobility has two positive impacts on device performance. First, in the active region of the device, the mobility in the current flow direction is large, which results in improved device performance. Second, the substrate is a parasitic resistance in series with the device, and therefore, a high mobility will result in a low substrate resistance. Small substrate resistance means a lower forward voltage drop and less power consumed (wasted) in the substrate, i.e. a more efficient device. In addition, less heat will be generated as a result of the substrate resistance. It should be noted that SiC has a thermal conductivity about 10 times larger than that of sapphire. This higher thermal conductivity aids in conducting heat away from the active junction region.

Figure 8:
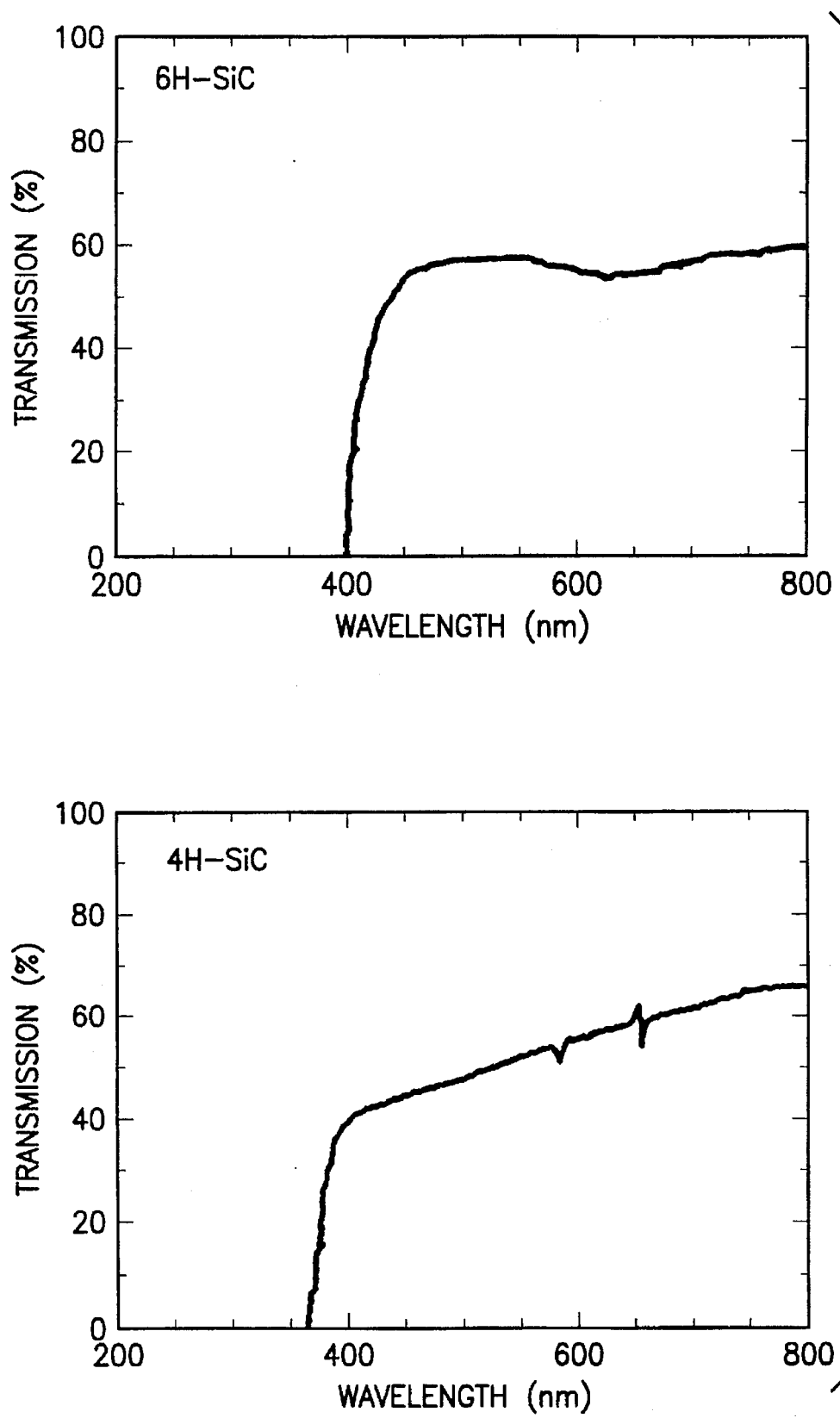
FIG. 8 shows percent transmission of light in the wavelength range 200 to 800 nanometers as a function of wavelength for 4H—SiC and 6H—SiC.

Optical properties of the substrate are also important. In this regard, another significant advantage of the 4H—SiC and 2H—SiC substrates relative to 6H—SiC is their larger band gaps. The larger band gaps make these substrates effectively transparent for shorter wavelength light emission. This means that 2H— and 4H—SiC substrates are effectively more transparent over a wider wavelength range than 6H— or 15R—SiC. Since in LEDs a great deal of light can come from out of the substrate, the selection of 2H or 4H polytypes offers a significant advantage. FIG. 8 shows percent transmission of light in the wavelength range 200 to 800 nanometers as a function of wavelength for 4H—SiC and 6H—SiC. It is clear that 4H is transparent over a wider wavelength range. Although the relative percent transmission numbers are not directly comparable because the percent transmission above the band edge wavelength also depends on the doping density, the wavelength at which transmittance goes to zero, or "cut-off" wavelength, is independent of the dopant concentration.

As FIG. 8 shows, the cut-off wavelength is significantly lower for the wider band gap 4H-polytype than for 6H—SiC, making this substrate suitable for light emitting devices that emit at higher energy ultraviolet wavelengths. The high energy transmission of 4H— and 2H—SiC enables higher efficiency LEDS that emit in the green-blue to ultraviolet range. High energy LEDs have uses in communications applications, where they can carry a higher density of information, and, in spectroscopy applications, where they can excite a wider range of energy level transitions.

As the concentration of dopants increases, transmittance decreases, and so conductivity and transmittance can be balanced in a trade-off situation. However, the higher carrier mobilities of the 2H—SiC, 4H—SiC and a-axis oriented 6H—SiC combined with high transmittance at short wavelengths allow doping levels to be selected for a device with optimized conductivity and transmittance, which has good electrical and optical properties.

Therefore, to summarize, substrates comprising hexagonal 2H—, 4H— and a-axis oriented 6H—SiC polytypes are preferred, and of the hexagonal polytypes, the 2H—SiC and 4H—SiC polytypes, which have wider band gaps than the 6H—SiC polytype, as well as higher carrier mobilities, are most preferred.

In contrast to the use of SiC as a substrate for GaN growth, many different types of devices have been made in SiC. Virtually all of these devices have been made on c-axis (0001) oriented 6H—SiC substrates. For all hexagonal SiC polytypes, there are actually two specific low index directions perpendicular to the c-axis: $(10\bar{1}0)$ and $(11\bar{2}0)$, which are generically called "a-axis." To date only one device has been proposed to be made on an a-axis oriented substrate. This is in an IMPATT development program at Westinghouse, funded by the Naval Weapons Center at China-Lake, Calif. ("High Power Silicon Carbide IMPATT Diode Development," Eldridge et al., 2nd Annual AIAA SDIO Interceptor Technology Conference, Jun. 6–9, 1993, Albuquerque, N.M.). To date, no actual devices have been reported to have been made on a-axis oriented substrates. GaN LEDs and lasers made on a-axis oriented SiC provide many advantages that have evidently not been previously appreciated.

While LEDs made using 6H—SiC epilayers on 6H—SiC substrates have been reported previously (U.S. Pat. No. 4,918,497), and GaN LEDs were described on c-axis (0001) oriented 6H—SiC substrates (U.S. Pat. No. 5,120,051), to date, there have been no reports of GaN-based optical devices (LEDs or lasers) grown on 2H—SiC, 4H—SiC or a-axis 6H—SiC substrates. Further, 2H— or 4H—SiC LEDs have not been described. Because of the wider band gaps of 4H—SiC, the light emission of such LEDs would be shifted in the ultraviolet direction. However, previous efforts have focused on obtaining blue light emission. There thus has been no motive to select 4H or 2H silicon carbide polytypes. Moreover, in combination with epilayers of the AlGaInN alloys, whose wavelength of light emission can be selected by modifying composition and thickness, these wider band gap polytypes show distinct and previously unappreciated advantages.

When the advantages of the electrical and optical properties of 2H—, 4H— and a-axis oriented 6H—SiC substrates are combined with growth of Ga*N-based active regions, with their high optical efficiency, a new high power optical emitter device structure is produced. GaN and related materials are very efficient optically because of their direct band gap. In addition, the ability to make heterostructures with alloys of AlN and InN enables heterostructure devices as well as the ability to select the output wavelength by choice of composition and/or thickness of the active region.

Figure 2:
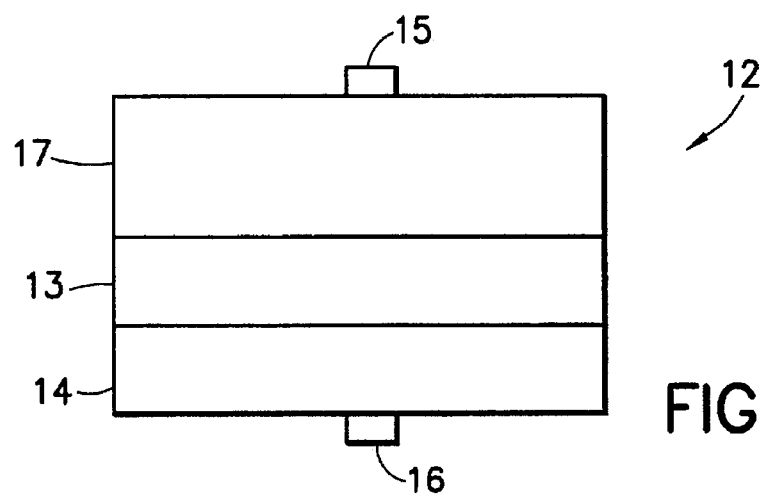
FIG. 2 shows a schematic of a light emitting diode according to the present invention, comprising a conductive SiC substrate, a Ga*N active region, a heavily doped Ga*N contact layer, and top and bottom electrical contacts.

FIG. 2 is a schematic sectional elevation view of a generalized LED structure 12 according to the present invention. The LED structure 12 comprises a green-blue to ultraviolet light emitting Ga*N material 13 on a base structure 14 comprising a SiC substrate. The diode structure 12 includes a p-n junction comprising Ga*N layers 13 and 17, a contact 15 on the upper surface of the Ga*N layer 17, and a contact 16 on the bottom surface of the base structure 14. The substrate is selected from any orientation of 2H—SiC or 4H—SiC, or a-axis oriented 6H—SiC.

Figure 3:
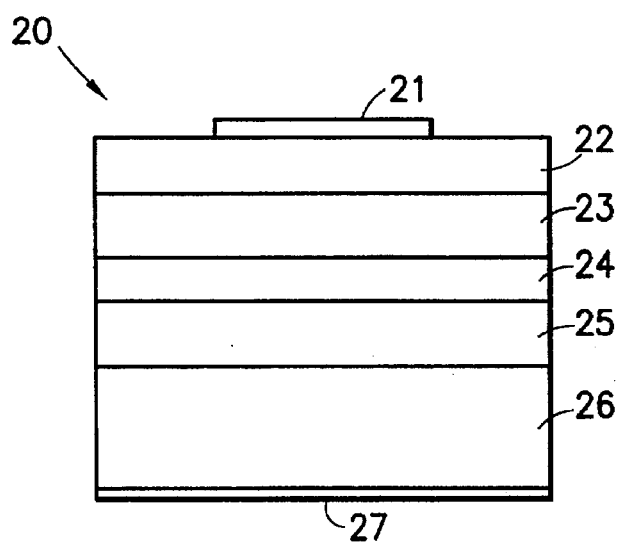
FIG. 3 shows a schematic of a light emitting diode according to the present invention, comprising a conductive n-type 4H—SiC substrate, an n-type AlGaN barrier layer, a GaN active region, a p-type AlGaN layer, and a heavily doped p-type GaN contact layer, incorporating a p-type contact to the top and an n-type contact to the bottom.

A schematic of an electroluminescent device according to the invention is shown in FIG. 3. The device 20 has a conductive substrate 26. The substrate may be n-type or p-type. On the substrate is formed a Ga*N barrier layer 25, a Ga*N active region 24 and a Ga*N barrier layer 23. Finally the structure is completed with a heavily doped contact layer 22, wherein "heavily doped" means a doping level of $\geq 10^{18}$ cm$^{-3}$, and preferably $\geq 10^{19}$ cm$^{-3}$. Contact 21 is formed to heavily doped contact layer 22 and contact 27 is formed to the conductive SiC substrate 26 on the lower side of the device. The Ga*N layers 23 and 25 have a larger band gap than the Ga*N active region, which confines the injected carriers and prevents them from diffusing out of the active region. This results in greater optical efficiency. The contact layer 22 should have as small a band gap as possible, making top contact formation easier. The device is fabricated by making a contact to the top and a contact to the bottom. The wafer is then diced up into individual devices.

In one embodiment of the device shown in FIG. 3, the device 20 has a conductive, n-type 4H—SiC substrate 26. On this substrate is formed a n-type AlGaN barrier layer 25, a GaN active region 24 and a p-type AlGaN layer 23. Finally the structure is completed with a heavily doped p-type GaN contact layer 22. Contact 21 is formed to the heavily doped p-type GaN contact layer and contact 27 is formed to the n-type SiC substrate on the lower side of the device. The AlGaN layers have a wider band gap than the GaN active region, which confine the injected carriers and prevents them from diffusing out of the active region, leading to greater optical efficiency. The p-type GaN contact layer has a narrower band gap than the AlGaN, making top contact formation easier. The device is fabricated by making a p-type contact to the top and an n-type contact to the bottom. The wafer is then diced up into individual devices.

Doping the Ga*N layers p-type can be achieved using Mg, C, or Zn as the dopant, introduced during growth, with Mg preferred. Source reagents such as $CCl_4$ (carbon dopant), bis(cyclopentadienyl)magnesium (Mg dopant), diethylzinc or dimethylzinc (Zn dopant), etc. may be employed to supply the dopants during deposition. P-type dopants can be activated by thermally annealing in a non-hydrogen-containing ambient (Ar, $N_2$, but not $NH_3$) or by LEEBI (low energy electron beam irradiation). However, the latter technique works only to the depth of the beam penetration, e.g. only a few microns using energies that are easily accessible in an electron microscope source.

Doping of the Ga*N layers n-type can be achieved in situ using Si, Se, or Te as dopant, introduced during growth, with Si preferred. Silane, disilane, hydrogen selenide or telluride, or organometallic Si, Se, or Te compounds are suitable precursors for the introduction of these dopants during growth. Contact materials that are suitable for the top contact include Ti/Mo/Au, Au/Ni or Au/Ge/Ni alloys or Au metal. For the bottom contact to the silicon carbide substrate, Ni, Pd, W or Ta may be employed.

It should be understood that the compositions of the barrier and active regions of the device shown in FIG. 3 may be modified to achieve different performance. The major aspect determining the composition of the active region is the desired output wavelength. This is determined by the band gap of the active region. The band gaps vs. lattice constants for a number of materials including the III–V nitrides are tabulated below.

| Material | Band Gap | Lattice Constant |
|---|---|---|
| AlN | 6.28 | 3.112 |
| GaN | 3.45 | 3.16 |
| InN | 2.09 | 3.544 |
| AlP | 2.45 | 5.467 |
| GaP | 2.26 | 5.4512 |
| InP | 1.35 | 5.8686 |
| AlAs | 2.15 | 5.6605 |
| GaAs | 1.42 | 5.65325 |
| InAs | 0.36 | 6.0584 |
| ZnS | 3.68 | 5.42 |
| CdS | 2.42 | 5.8320 |
| CdSe | 1.70 | 6.050 |
| CdTe | 1.56 | 6.482 |
| Si | 1.12 | 5.43095 |
| 3C—SiC | 2.2 | 4.36 |
| 6H—SiC | 2.9 | 3.09 |
| ZnO | 3.35 | 4.580 |
| Sapphire | — | 4.758 |

It is clear that adding AlN to GaN increases the band gap while adding InN to GaN decreases the band gap. The band gap of GaN is 3.4 eV which corresponds to a wavelength for band-to-band light emission of about 365 nm. For a blue LED, the wavelength should be in the range of 440 to 480 nm, which requires the addition of 5–50 mole % In to a GaN active region. In other words, the active region should have a composition of $In_xGa_{1-x}N$ where $0.05<x<0.50$ to produce a blue LED. This range will produce different shades of blue. This wide range is specified because the emission may come from band-to-band or impurity recombination. If it is band-to-band, then the output wavelength is clearly determined by the band gap. On the other hand, if it is impurity related recombination, then the output wavelength is less than the energy of the band gap by approximately the ionization energies of the dopants. The structure depicted in FIG. 3 can be used to provide light emission from the UV to visible by appropriate variation of the compositions in the active layer 24.

In another embodiment of an LED emitting in the blue region of the optical spectrum, x in the composition $In_xGa_{1-x}N$ ranges from $0.05<x<0.50$, preferably in the range of $0.07<x<0.15$. In the $Al_yGa_{1-y}N$ barrier layers, y could vary from 0 to 0.3, preferably 0 to 0.15.

An alternative version would use a p-type substrate, a p-type barrier layer followed by the active region and an n-type barrier layer and n-type contact layer.

It is also understood that the lower band gap contact layer on the top of the structure may be made of an InGaN alloy or InN for improved contacts, alternatively the contact layer may be omitted.

Other versions of this device utilizing the conductive SiC substrate could have active regions made out of quantum wells. In this case, the active region is thin enough that quantum size effects as well as layer composition control the emission wavelength. In this case the emission wavelength is determined by the well width, the well composition and the barrier composition. In general, as the well width is decreased, the emission energy is increased.

The active region may also consist of a Ga*N material of lower band gap than the cladding layers 23 and 25, but instead of having an active region of uniform composition, could have one or more wells of Ga*N layers of even lower band gap material than the bulk of the active region. The carriers will thermalize into those wells and emit light with a wavelength dependent on the band gap and thickness of the well materials.

An additional structural modification to increase the light output employs a dielectric Bragg mirror underneath the LED structure. The Bragg mirror structure may suitably comprise sequential layers of metallonitride materials (compounds or alloys), e.g. alternating layers of AlN, GaN, InN or their alloys, "Ga*N," where the term Ga*N refers to binary (e.g. GaN), ternary (MGaN), and quaternary (MM'GaN) type gallium nitride compounds, including, by way of example, such compounds as AlN, InN, AlGaN, InGaN, InAlN and AlInGaN, where M is a metal which is compatible with Ga and N in the composition MGaN and the composition MGaN is stable at standard temperature and pressure (25° C. and one atmosphere pressure) conditions, and wherein M' is a compatible metal providing quaternary compounds of the formula $M_{1-x-y}M'_yGa_xN$, wherein x and y range from 0 to 1.

Figure 4:
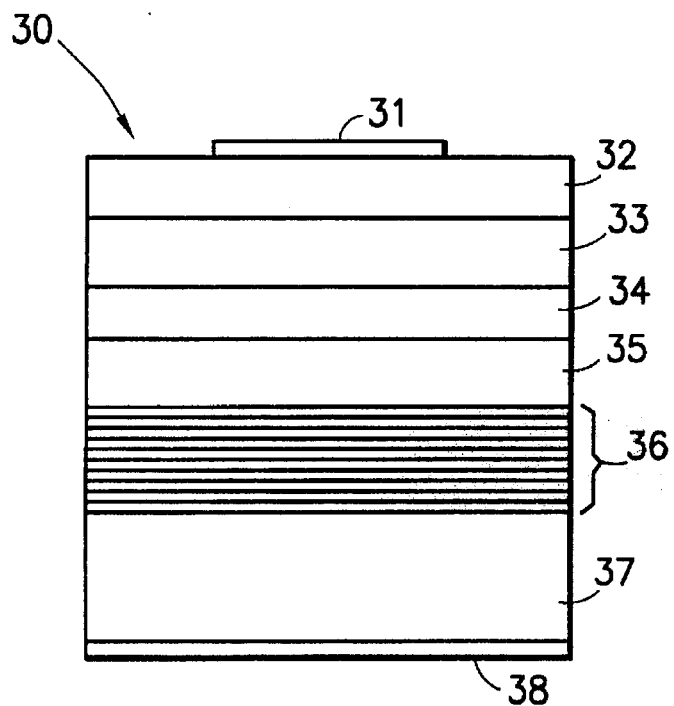
FIG. 4 shows another embodiment of an LED according to the present invention, incorporating a structural modification to increase the light output comprising a dielectric Bragg mirror beneath the LED structure, made of alternating layers of AlN, GaN, InN or their alloys.

This Bragg mirror structure acts as a mirror for specific wavelengths, and increases the light output by efficiently reflecting light up and out of the device. FIG. 4 shows a schematic of this type of structure, where the light emitting device 30 comprises a silicon carbide substrate 37, wherein the silicon carbide substrate is preferably of the 2H, 4H, or a-axis 6H polytype, upon which is grown a Bragg mirror 36 comprising alternating layers of AlN, GaN, InN or their alloys. A barrier layer 35 of n-type Ga*N is grown on the Bragg mirror, followed by the active region 34 which may comprise Ga*N, and a p-type Ga*N layer 33. Finally the structure is completed with a heavily doped p-type Ga*N contact layer 32, wherein "heavily doped" means a doping level of $\geq 10^{18}$ cm$^{-3}$, and preferably $\geq 10^{19}$ cm$^{-3}$. Contact 31 is formed to heavily doped p-type Ga*N contact layer and contact 38 is formed to the SiC substrate on the lower sides of the device. As described previously, the Ga*N layers 33 and 35 have band gaps larger than the active region 34. The contact layer has as small a band gap as possible or may be omitted. Of course, the doping scheme could be reversed, using a p-type substrate, and so forth.

The Bragg reflector acts as a frequency-dependent mirror, that is the peak in the reflectivity spectrum is determined by the layer thicknesses in the structure. The design of the Bragg reflector is governed by the dielectric reflector expression (W. Driscoll and W. Vaughan eds, "Handbook of Optics," McGraw-Hill, N.Y., 1978, Chp. 8.):

$$n_1 t_1 + n_2 t_2 = \lambda/2$$

where $n_1$ and $n_2$ are the indices of refraction at the wavelength, $\lambda$ and $t_1$ and $t_2$ are the thicknesses of the materials in the reflector. The total reflection from the reflector is given by:

$$R\max = \{[(n_m/n_s) - (n_1/n_2)^{2N}]/[(n_m/n_s) + (n_1/n_2)^{2N}]\}^2$$

where N is the total number of periods of materials 1 and 2 and $n_i t_i$ for each of these layers is an odd multiple of $\lambda/4$. The index $n_m$ is for the medium into which the light is reflected and $n_s$ is the index of the substrate on which the stack resides. This expression gives the peak reflectivity; the peak reflectivity decreases as the wavelength varies either higher or lower than $\lambda$.

The refractive index of AlN is reported to be $n_{AlN} \approx 2.1$. The refractive index of GaN in the blue part of the spectrum lies near $n_{GaN} \approx 2.6-2.7$. Using these values along with the wavelength of maximum emission for a GaN diode of $\approx 430$ nm, the thicknesses of the GaN and AlN layers are 41 and 51 nm, respectively (assuming maximum reflection from the mirror). It should be noted that the index ratio for GaN/AlN is very similar to that of GaAs/AlAs, which indicates that highly reflective mirrors will be achievable.

To date there has been only one report of a Bragg reflector made in the AlGaN system. This utilized 18 periods of GaN and $Al_{0.2}Ga_{0.8}N$ layers. The peak reflectivity was measured to be 80% at 442 nm for this structure (M. A. Kahn, J. N. Kuznia, J. M. Van Hove, D. T. Olson, Appl. Phys. Lett. 59, 1449 (1991)).

In addition to reflectivity, the resistance of the Bragg mirror is also very important. Current must flow through the reflector, and if it has a high resistance, thermal heating and device degradation occur. Even if device destruction does not occur, overall device efficiency will suffer. One problem with the simple Bragg reflector is that the potential barriers in the superlattice (which result from different band gaps of these materials) impede the carrier flow and result in large series resistances.

There are a number of methods for reducing the series resistance of the Bragg reflector. The first is to make the material in the reflector as conductive as possible. However this does not reduce the potential barriers in the conduction and valence band. These barriers can be reduced by grading the composition at the interface instead of having an abrupt change. Grading can be done in two ways. The first is to change the flux of the constituent species as a function of time. The second is to insert either a layer of intermediate composition or a short period superlattice at the interface between the two main layers.

LEDs are made in the simplest possible way to achieve low costs and high yield. Many LEDs are defined simply by the dicing operation that occurs to separate them. Damage induced at the edge of the LED during the dicing operation may cause a decrease in the radiative efficiency or lifetime of the device. Such damage is often removed by performing an etch after dicing to remove the damaged material. The present invention encompasses an alternative to such etching, which involves fabrication of the individual devices by a mesa etching technique which provides an alternative structure which does not require this etching. Device definition may thus be performed during the fabrication step to keep damage from the dicing operation away from the active region.

Figure 5:
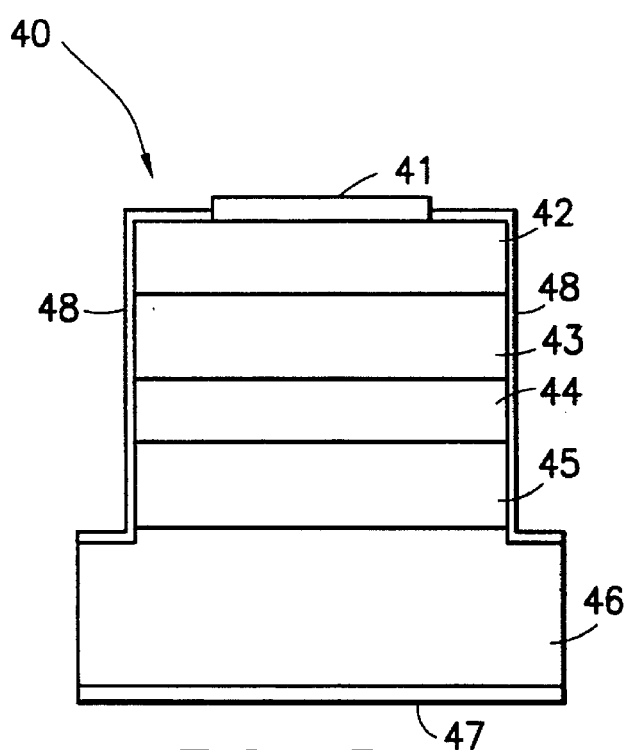
FIG. 5 shows a device which is defined during device fabrication by a process comprising mesa etching, passivation of the mesa edge and contact formation, to produce a device in which the critical p-n junction edge region is removed from the dicing region.

The conventional LED structures are shown in FIGS. 2 and 3. These devices are defined by the dicing operation. FIG. 5 shows a device which is defined during device fabrication by a process consisting of mesa etching, passivation of the mesa edge and contact formation. Finally the wafer is diced to separate the devices. The major difference between this structure and the one shown in FIG. 3 is that in the mesa device, the critical p-n junction edge region is spatially separated from the dicing region. This prevents any dicing damage from encroaching into the active region, which may degrade the device characteristics.

In FIG. 5, the LED 40 comprises a silicon carbide substrate 46 followed by a n-type Ga*N barrier or cladding layer 45, a Ga*N active layer 44, and a p-type cladding Ga*N layer 43, and a heavily doped p-type Ga*N contact layer 42. Contact 41 is formed to heavily doped p-type GaN contact layer and contact 47 is formed to the SiC substrate on the lower sides of the device. A passivation layer 48 protects the device from degradation and reduces surface leakage currents. The passivation layer may comprise silicon dioxide, silicon nitride or other materials. Layers of these materials are deposited using chemical vapor deposition, sputtering, plasma-assisted deposition, or other layer-forming processes known in the art. The passivation layer thickness may range from 200 to 2000 Å. The cladding layers 43 and 45 have larger band gaps than the active layer 44. These devices are made by masking of the grown LED structure and etching the mesas after growth.

Typical metallurgy for the p-type contact uses aluminum or gold/aluminum alloys which are annealed at temperatures from 700° C. to 1000° C. N-type contact metallurgy includes Ni, W, Pd, and Ti. These metals are annealed at 800° C. to 1100° C. to form the contact, excluding Ti which is ohmic as deposited.

The wafer is then sawed using a dicing saw to produce individual LED devices. Because the p-n junction is spatially separated from the sawed edge, no post-sawing processing is required.

Defects pose a serious problem to light emitting devices; they can reduce the optical efficiency as well as shorten the lifetime of the device. Often optical devices have dark line defects which multiply during operation. With continued operation, the density of these defects increase until the light output is reduced to an unacceptable level and device failure occurs. In the proposed structure, which does have a small lattice mismatch between the substrate and the epitaxial layers, and a smaller mismatch between the GaN and AlGaN layers, misfit dislocations due to these lattice mismatches are of potential concern. These are addressed in three ways. The first is the use of buffer layers including single composition layers as well as superlattices and strain layer superlattices. The second method is to perform the growth on reduced area mesas which results in a reduction in dislocation density in the epitaxial layers. Finally the choice of a SiC substrate, because of its high thermal conductivity, will keep the junction temperature lower and result in much lower rate of defect propagation. In addition, the closer thermal coefficient of expansion (TCE) match between GaN and SiC compared to GaN and sapphire greatly reduces the density of dislocations generated during cooldown after growth of the epitaxial layers.

As discussed above, the main lattice mismatch comes between the substrate and epitaxial layers. By choosing a SiC substrate instead of the more typical sapphire, we have reduced that mismatch from 13.8 to about 0.9–3.4%, depending on the alloy composition. This will result in a large reduction in misfit dislocation density at the substrate/epitaxial layer interface. The misfit can be minimized by using high Al alloy compositions in the cladding layer, which make up most of the device volume. In addition, the closer TCE values will result in fewer defects generated during cool-down after epitaxial growth. The TCE value for GaN is about 5.6 versus 5.1–5.9 for SiC (range of literature values) and about 7.5 for sapphire. Thus, the use of SiC instead of sapphire will result in improved surface morphology, less wafer warpage as well as a reduction in dislocation density due to mismatches in TCE. Still, the thicknesses required for these optical devices (LED, laser) will exceed the critical thickness for misfit dislocation generation and additional approaches are used to mitigate these.

Three approaches can be used to deal with the misfit dislocations. The first is to use a buffer layer between the substrate and epitaxial layer. This is a common technique in the growth of lattice mismatched materials, and both AlN and GaN buffer layers have been used to advantage with the nitrides on sapphire substrates. In addition, more sophisticated buffers, for example strained-layer (Al,Ga)N superlattices, may be employed to further reduce the defect density. This type of buffer has been used in the III–V arsenides to reduce dislocation densities by about a factor of 10.

The second defect reduction technique is to grow on reduced-area mesas. This technique has been used in the GaAs/InGaAs and Si/SiGe material systems. For example, a reduction in linear interface dislocation density with decreasing mesa diameter is observed for 7000 Å of $In_{0.05}Ga_{0.95}As$ grown on GaAs. A significant reduction occurs as the diameter is reduced from 200 to less than 50 µm. The mechanism for this dislocation reduction is that, because of the small area, dislocations are able to move to the edges of the pedestal and annihilate there before encountering and interacting with other dislocations. LEDs typically have an active region of about 170 µm in diameter and so we expect some dislocation reduction by growing on a mesa of this diameter.

Figure 7:
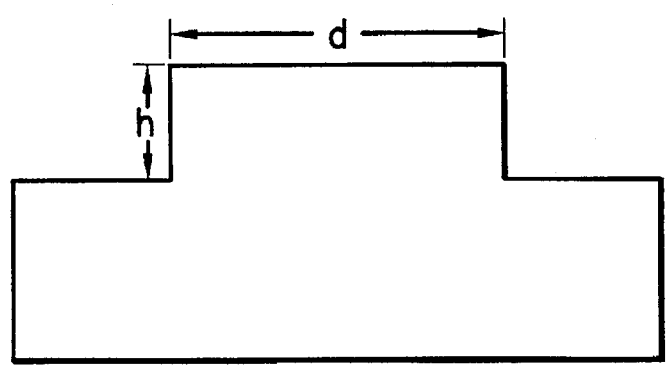
FIG. 7 shows a schematic representation of a mesa region of a device which could, e.g., be fabricated by the process depicted in FIG. 6.

FIG. 7 shows an individual mesa prepared as above. The mesas are typically squares, with a side dimension ranging from 150 to 200 µm, with 160 to 180 microns preferred. Their "equivalent diameter" dimension d ranges from 150 to 300 µm, with 250 to 300 µm preferred. As used herein, the term "equivalent diameter" means the diameter of a cylindrical shaped mesa which is equivalent in mesa top surface area to the mesa being considered. Thus, when the mesa in fact is of cylindrical shape and circular cross-section, the equivalent diameter is equal to the actual diameter measured on the circular top surface. For a polygonal or irregularly shaped mesa top surface, the top surface area may be used to determine the diameter of a circular cross-section of the same quantitative top surface area. The mesa height h relative to the substrate plane ranges from 1 to 15 µm, with 3 to 8 µm preferred.

Figure 6:
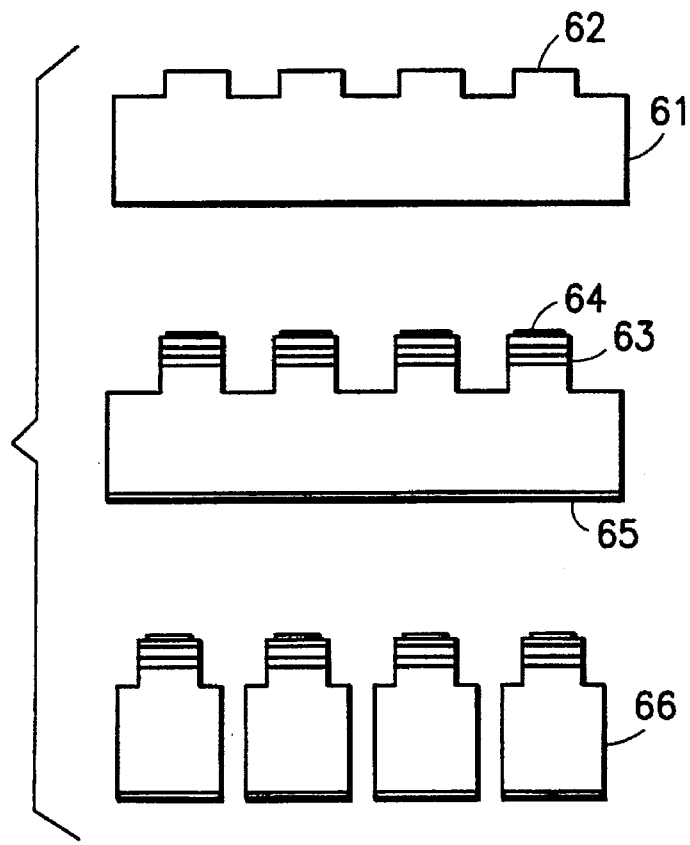
FIG. 6 shows a schematic of an LED fabrication process for LEDs grown on reduced area mesas according to the present invention.

FIG. 6 shows a schematic representation of an exemplary process used to produce such mesa-defined devices. The substrate 61 is first patterned with mesas 62 of the desired shape and dimension. Mesas may preferably be either circular or square, with circular preferred, having 150–300 µm equivalent diameter, preferably in the range of 200–250 µm. The substrate is patterned with metal (Ni, Al) which has been photolithographically patterned to the shape of the desired mesas. The non-masked areas are etched using reactive ion etching to a depth of 1–15 µm, and preferably 3–8 µm. The metal is then removed and the substrate is cleaned for epitaxial growth. The LED structure, which consists of layers 63, the active layers and cladding, is formed by successive steps of MOVPE growth (described above). Again, the structures are masked with metal to protect the mesa tops, and to remove the material which was conformally deposited on the mesa sidewalls, another reactive ion etching step is performed. The metal may form the top contact 64 or it can constitute the mask, in which case another step is required to form the contact. A back metal contact 65 is deposited on the back of the wafer. After separation by a suitable technique, e.g. dicing, mechanical or laser scribing and cleaving, or sawing, the individual devices 66 are ready to be packaged.

The third approach to reducing the impact of defects arises from the use of the SiC substrate. Dark line defects are known to multiply because of device heating during operation. One way to reduce this effect is by reducing heating of the device. The SiC substrate has a thermal conductivity that is about 10 times greater than that of sapphire. Therefore, the junction region will be cooler, which will reduce the propensity of the defects to multiply, and thus extend device lifetime.

Methods for forming the device structures can be adapted from techniques that have been developed in SiC, GaAs and silicon materials and device processing technology. Single crystal silicon carbide substrates can be prepared by sublimation growth, as described by Tairov and Ziegler (Y. M. Tairov, V. F. Tsvetkov, J. Crystal Growth 43 (1978) 209; 52 (1981) 146; G: Ziegler et al., IEEE Trans. Electron Devices ED-30 (1983) 277)). GaN and other III–V nitride layers may be deposited by several techniques, including low and high pressure and plasma-enhanced chemical vapor deposition (CVD), reactive ionized-cluster beam deposition, reactive and ionized molecular beam epitaxy (MBE), and hydride vapor phase epitaxy (VPE). For n-type materials, doping of the III–V nitride is achieved typically using silicon from silane or disilane. Other ntype dopants include sulfur, selenium and tellurium. P-type doping has been more problematic in the III–V nitrides. One recent method is to use electron beam irradiation to activate dopants. The disadvantage of this approach is that it is a slow, expensive process and cannot be used in structures with arbitrary thickness.

The fabrication method of the present invention employs a combination of control of specific growth conditions as well as thermal annealing after growth to achieve active p-type dopants. Typical p-type dopants include Mg, Be, Zn, Cd and C.

Figure 9:
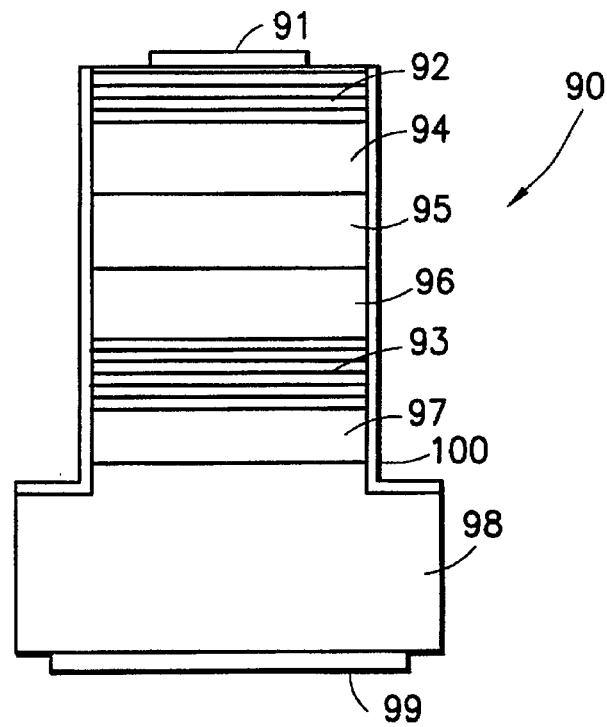
FIG. 9 shows a schematic representation of a semiconductor laser according to the present invention.

FIG. 9 shows a schematic representation of a semiconductor laser 90 according to the present invention. The laser comprises a top contact 91, top Bragg reflector 92, bottom Bragg reflector 93, cladding layer 94, active layer 95, cladding layer 96, buffer 97, substrate 98, bottom contact 99, and passivation layer 100. Other semiconductor laser structures can incorporate a key aspect of the invention, the green-blue to ultraviolet light emitting Ga*N material on a base structure comprising a SiC substrate selected from the group consisting of 2H—SiC, 4H—SiC and a-axis oriented 6H—SiC.

Figure 10:
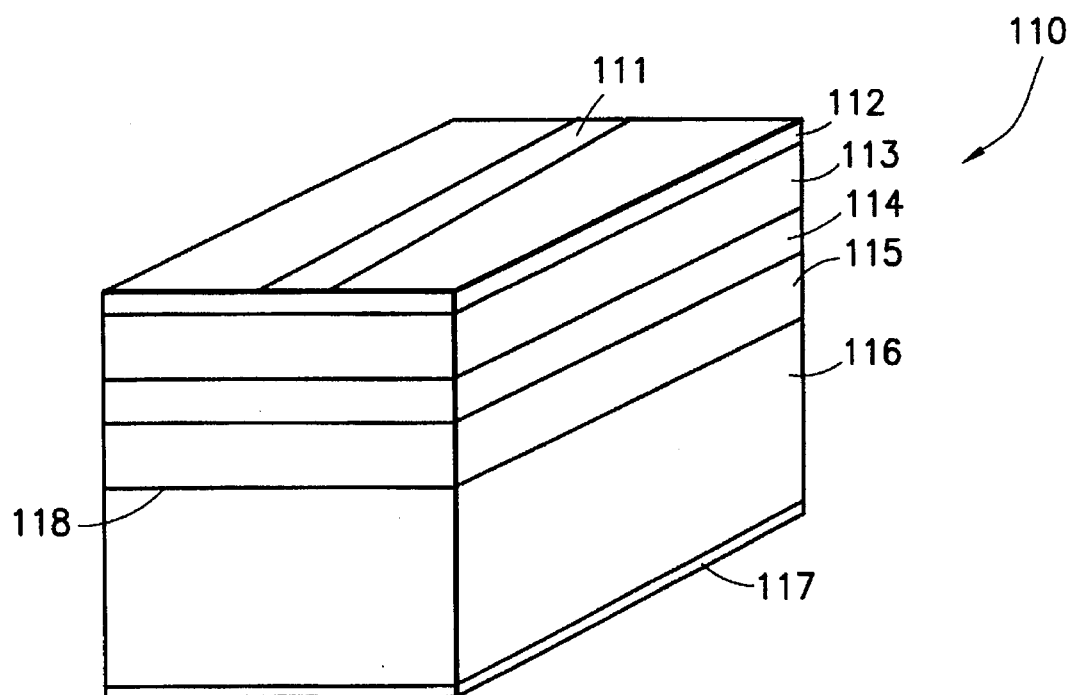
FIG. 10 shows a schematic representation of a semiconductor laser showing a side view to expose a facet.

FIG. 10 depicts another example of a laser structure 110 according to the present invention. Laser 110 comprises top contact 111, contact layer 112, cladding layer 113, active layer 114, cladding layer 115, substrate 116, and bottom contact 117. Face 118 and the corresponding face on the opposite side of the device constitute laser facets or mirrors. Light is emitted from the active layer on the facet sides, beneath the contact. Layers 113 and 115 have larger band gaps than 114, and are complementarily doped, one p-type and one n-type.

Although the invention has been described with respect to particular features, aspects, and embodiments thereof, it will be apparent that numerous variations, modifications, and other embodiments are possible within the broad scope of the present invention, and accordingly, all variations, modifications, and embodiments are to be regarded as being within the spirit and scope of the invention.

What is claimed is:

1. A method of making a green-blue to ultraviolet light-emitting diode comprising forming a green-blue to ultraviolet light emitting material selected from the group consisting of:
   GaN;
   MGaN; and
   MM'GaN
   wherein:
   M is a metal which is compatible with Ga and N in the composition MGaN and the composition MGaN is stable at 25° C. and one atmosphere pressure conditions, and
   M' is a compatible metal providing quaternary compounds of the formula $M_{1-x-y}M'_yGa_xN$, wherein x and y range from 0 to 1, on a base structure comprising a SiC substrate selected from the group consisting of 2H—SiC, 4H—SiC and a-axis oriented 6H—SiC.

2. A method according to claim 1, wherein said base structure comprises at least one mesa on a top surface thereof, with said green-blue to ultraviolet light emitting material deposited on at least one mesa.

3. A method according to claim 2, wherein said at least one mesa on said base structure includes a main mesa surface having an equivalent diameter of less than 350 micrometers.

4. A method according to claim 2, wherein said at least one mesa on said base structure includes a main mesa surface having an equivalent diameter of less than 200 micrometers.

5. A method according to claim 2, wherein said at least one mesa is formed on a top surface on said base structure by etching a masked precursor base structure to a predetermined depth to yield said at least one mesa.

6. A method according to claim 1, wherein at least one mesa is formed on a top surface on said base structure after deposition of said green-blue to ultraviolet light emitting material on said base structure by etching of said deposited green-blue to ultraviolet light emitting material and underlying base structure to a predetermined depth to yield said at least one mesa.

7. A method according to claim 2, wherein said mesa structure formation comprises patterning said base structure with a metal mask defining said mesa structure, etching said patterned base structure to a predetermined depth, removing said metal mask, and depositing said green-blue to ultraviolet light emitting material on upper surfaces of said mesa structure.

8. A method according to claim 1, wherein the light-emitting green-blue to ultraviolet light emitting material includes a quantum well region.

9. A method according to claim 1, further comprising forming a Bragg mirror layer between the SiC substrate and the light-emitting green-blue to ultraviolet light emitting material.

10. A method according to claim 9, wherein the dielectric Bragg mirror comprises of green-blue to ultraviolet light emitting material.

11. A method according to claim 1, wherein the base structure comprises a buffer layer on said SiC substrate, between said SiC substrate and said light-emitting green-blue to ultraviolet light emitting material.

12. A method according to claim 11, wherein said buffer layer comprises a strained layer green-blue to ultraviolet light emitting superlattice.

13. A method according to claim 1, wherein the green-blue to ultraviolet light emitting material is selected from the group consisting of: GaN, AlGaN, InGaN, and AlInGaN.

14. A method according to claim 1, wherein the green-blue to ultraviolet light emitting material is selected from the group consisting of: GaN, AlGaN, InGaN, and AlInGaN.

15. A method according to claim 1, wherein the green-blue to ultraviolet light emitting material is GaN.

* * * * *